United States Patent [19]
Kozicki et al.

[11] Patent Number: 5,314,772
[45] Date of Patent: May 24, 1994

[54] HIGH RESOLUTION, MULTI-LAYER RESIST FOR MICROLITHOGRAPHY AND METHOD THEREFOR

[75] Inventors: Michael N. Kozicki, Phoenix; Shao-Wen Hsia, Tempe, both of Ariz.

[73] Assignee: Arizona Board of Regents, Tempe, Ariz.

[21] Appl. No.: 895,576

[22] Filed: Jun. 8, 1992

Related U.S. Application Data

[63] Continuation of Ser. No. 594,299, Oct. 9, 1990, abandoned.

[51] Int. Cl.$^5$ ............................ G03C 3/00; G03C 5/00; G03F 7/26
[52] U.S. Cl. ............................................. 430/14; 430/9; 430/270; 430/313; 430/316; 430/317
[58] Field of Search ............... 430/270, 271, 313, 314, 430/316, 317, 322, 325, 9, 495, 14

[56] References Cited

U.S. PATENT DOCUMENTS

| | | | |
|---|---|---|---|
| 4,269,935 | 5/1981 | Masters | 430/314 |
| 4,316,946 | 2/1982 | Masters | 430/271 |
| 4,371,608 | 2/1983 | Das | 430/314 |

OTHER PUBLICATIONS

Bernstein, G. H., et al., "High Resolution Electron Beam Lithography with Negative Organic and Inorganic Reists", J. Vac. Sci. Technol. B 6 (6), Nov./Dec., 1988 pp. 2298–2302.

*Primary Examiner*—Marion E. McCamish
*Assistant Examiner*—Kathleen Duda
*Attorney, Agent, or Firm*—David G. Rosenbaum

[57] ABSTRACT

A high resolution, multi-layer resist for use in microlithography and a method is disclosed. The resist consists of a planarized layer deposited onto a substrate and an active layer, consisting of arsenic sulfide and silver is deposited onto the planarized layer. Irradiation with light, or other source of irradiation causes the silver to ionically diffuse into the arsenic sulfide, thereby creating a non-phase separate ternary chalcogenide glass. Removal of either the reacted or unreacted ternary compound will provide a positive or negative mask which may be used in subsequent processing or left as an intermetal dielectric as part of the underlying circuitry.

26 Claims, 3 Drawing Sheets

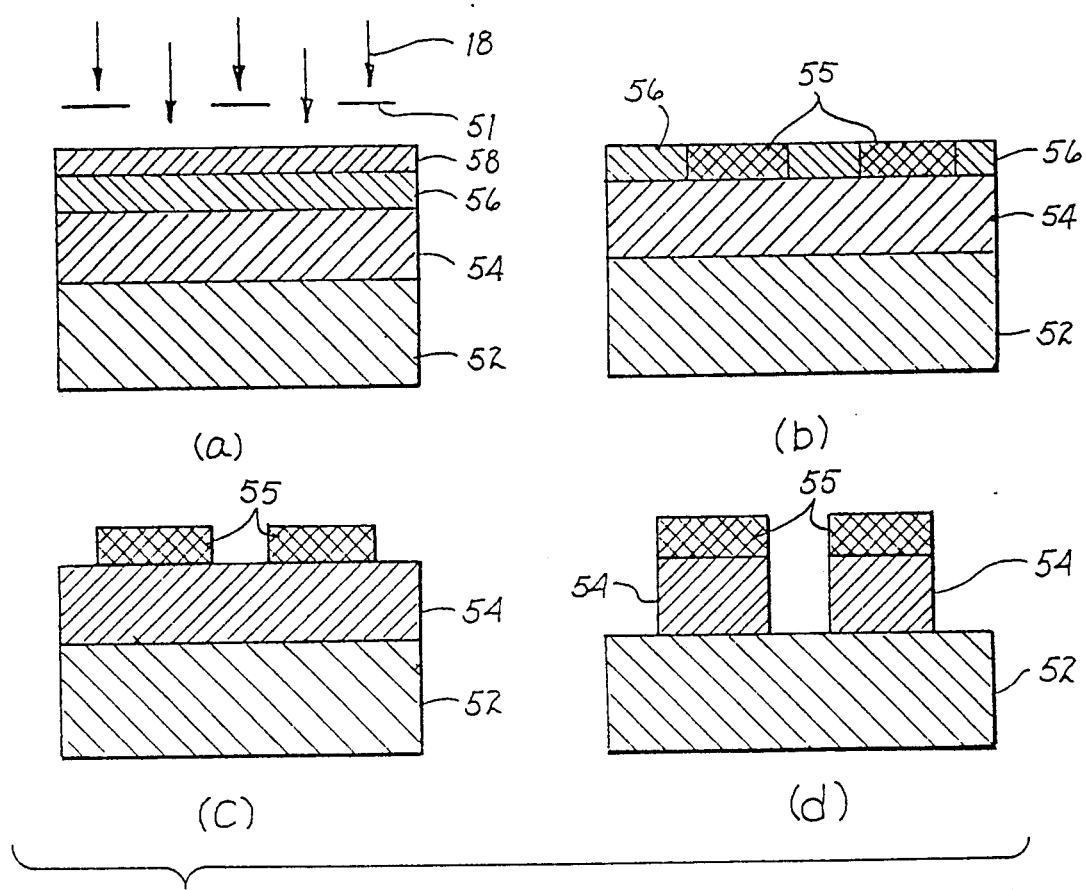
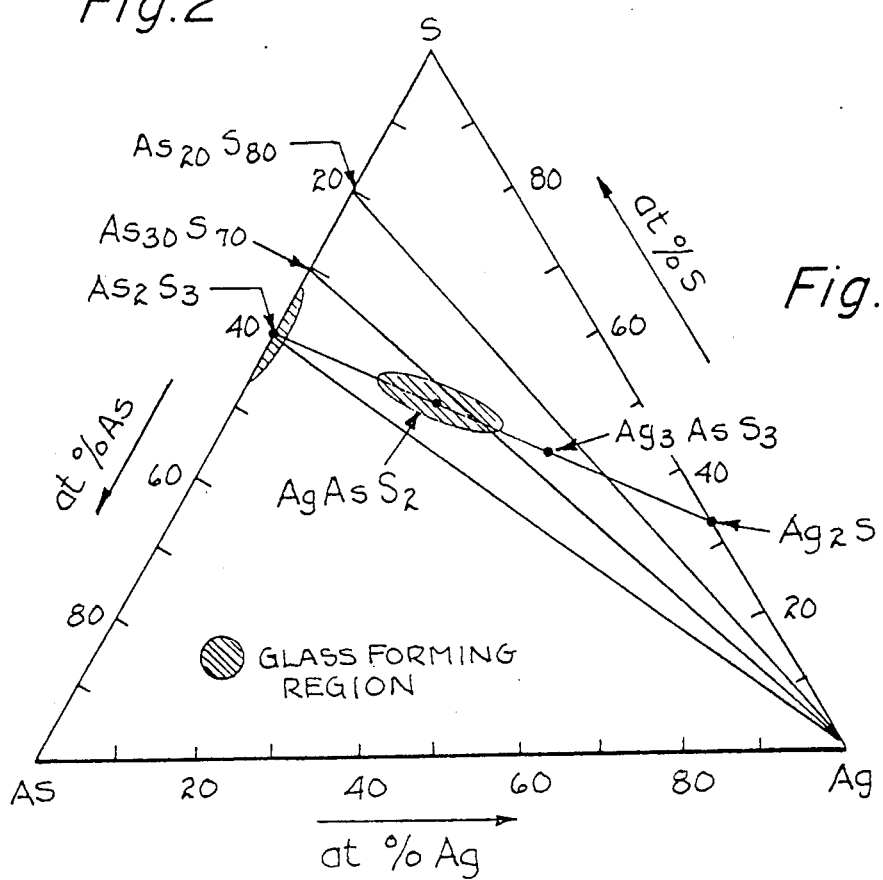
Fig.2
Fig.3

HIGH RESOLUTION, MULTI-LAYER RESIST FOR MICROLITHOGRAPHY AND METHOD THEREFOR

This is a continuation of copending application Ser. No. 07/594,299 filed on Oct. 9, 1990 now abandoned.

BACKGROUND OF THE INVENTION

The present invention relates generally to resist materials employed in the manufacture of integrated circuits and microcomponents. More particularly, the present invention relates to a high resolution, multi-layer resist for use in microlithography for the formation of microelectronic circuits.

The rapid movement toward higher levels of integration in monolithic circuits has been made possible by increased component packing densities and smaller geometries within the devices and circuits. These advances are due principally as a result of advances in lithographic techniques and in resist technology, however limitations in the resists have become the resolution limiting factor.

The minimum feature size is determined by the combination of the capabilities of the system optics and the contrast value of the photoresist. The photoresist contrast values for conventional optical resists are actually quite poor. Theoretical resolution of a typical lithography system must be two or more times greater than the feature size being defined. Thus, the equipment is theoretically capable of resolving features which are finer than those currently achieved. This characteristic suggests that current systems may be used to achieve higher resolution if higher contrast resists were available.

The difficulties in achieving higher resolution may be met by providing thinner resist coatings. However, thinner coatings typically cannot withstand subsequent processing. Thin organic films produced by spin casting are prone to pin holes, which are remedied b compromising thickness. Conventional organic resists are developed with wet developers which often causes resist swelling which, in turn, causes resolution loss, bridging of adjacent features and snaking of narrow lines. Moreover, with wet development schemes, desired materials will not readily dissolve into small spaces due to surface tension exclusion effects.

The problems of the current lithographic techniques are not met solely with higher resolution capabilities. Higher numerical aperture (NA) lenses may provide better resolution, but also result in decreased depth of focus and decreased field size. Reduced depth of focus is a serious deficiency when the systems are employed in modern integrated circuits having multiple levels of metalization. These types of circuits tend to have relatively large changes in surface elevation which may cause some regions to be out of focus. Additionally, conventional spin-on techniques tend to deposit a layer having varying thickness which is thinner at the edges of raised features. These thinner resist areas are then prone to overexposure and a change in line width occurs at the steps between the raised feature and its adjacent depression. The current tri-level resist schemes help to solve these problems but are non-ideal due to the complexity of the deposition and development processes. Tri-layer schemes also employ conventional organic photoresists and will, therefore, suffer from many of the aforementioned problems related to these materials.

With conventional photoresists, reflections from the substrate may create standing waves which reduce photo speed and create an uneven exposure in the resist. If the underlying layer is highly reflective, incident light is reflected laterally into the resist where the layer passes over steps. This leads to a change of line width at the steps known as "reflective notching".

Thus, the resist systems currently employed in microlithographic techniques suffer from a variety of problems which may be met by providing a high contrast resist system which can be dry developed, a resist material which is self-planarizing to avoid focus problems and which facilitates deposition of a uniformly thick photoactive layer, and which has a light absorbing photoactive region at the surface to guard against reflective notching. Additionally, the deficiencies of the current multi-layer resists dictate their solution by a new multi-layer resist scheme having enhanced high resolution capability and which will exhibit utility using a wide range of exposure methods including without limitation, light, x-ray, laser, ion beam and electron beam systems.

SUMMARY OF THE INVENTION

According to a broad aspect of the invention, there is provided a multi-layer resist system consisting principally of a planarized layer deposited upon a substrate and an active layer which is exposed to irradiation. The planarized layer may be spun on or otherwise deposited, and may be photoactive if desired according to a design, but photoactivity of the planarized layer is not essential. The planarized layer is thick enough to reduce the possibility of pin holes, and, if spun-on, is baked at a sufficient temperature to cause flow which seals the pin holes and removes the solvent to leave a film with few volatile components. The active layer is a thin film of chalcogenide glass, arsenic sulfide, topped with a coating of elemental silver. When exposed to light or other irradiation, the silver ionically diffuses into the arsenic sulfide to create a non-phase separated ternary chalcogenide glass compound which has very different material properties when compared to the arsenic sulfide alone.

After exposure to irradiation and formation of the non-phase separated ternary chalcogenide glass, the unreacted arsenic sulfide is soluble in a $CF_4$ plasma, and the ternary compound is extremely insoluble under the same conditions. The unreacted silver may be removed by sputtering or a wet chemical dip and the unreacted arsenic sulfide regions may be removed by reactive ion etching with $CF_4$ to selectively expose the underlying planarized layer. The unremoved ternary compound may now be used to selectively protect the planarized layer during a subsequent etching step, in an $O_2$ plasma or in NaOH, to yield a negative of the mask pattern. Alternatively, a positive image of the mask pattern may be produced by processing the exposed resist by reactive ion etching using a sulfur gas plasma to dissolve the ternary, but not completely dissolve the unexposed arsenic sulfide. Thus, either a negative or positive image may be obtained using the same resist scheme but using a different reactant during subsequent development. While the dry development schemes provide better resolution, wet development techniques may also be employed in the processing.

The resulting structure may be used either as a surface mask or left as a patterned underlayer, such as an inter-metal dielectric, which remains as part of the finished circuit or structure.

These and other objects, features and advantages of the present invention will become more apparent to those skilled in the art from the following, more detailed description of the invention with reference to its preferred embodiments and to the accompanying drawings.

BRIEF DESCRIPTION OF THE DRAWINGS

FIG. 2 is a cross-sectional diagrammatic representation of the formation of the high resolution resist material during different process stages of formation.

FIG. 3 is a ternary phase diagram of the As-S:Ag system showing glass forming regions.

DETAILED DESCRIPTION OF THE PREFERRED EMBODIMENTS

Figure 1:
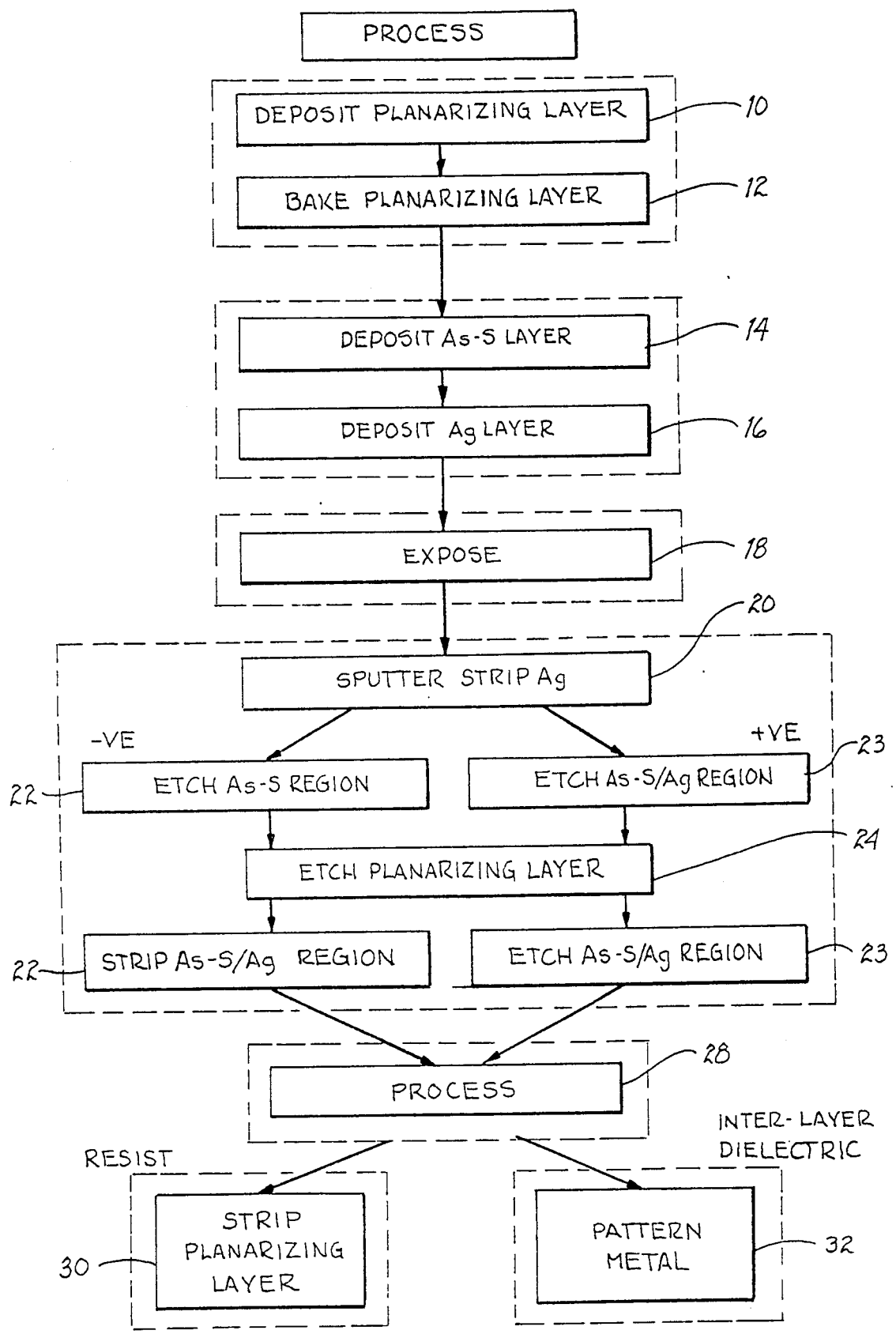
FIG. 1 is a process flow diagram illustrating the process for forming the high resolution, multi-layer resist of the present invention.

In accordance with the method of the present invention, and as illustrated with reference to FIG. 1 in the accompanying drawing, the process of forming the multi-layer resist according to the present invention is diagrammatically illustrated. The process assumes the provision of a substrate, such as a silicon wafer. The process consists generally of the following steps:

1. A planarized layer is spun or deposited onto the substrate 10. The planarized layer may be made of virtually any material which is self-leveling by spin casting, and may consist of organic or inorganic materials. Alternatively, planarization may be achieved by deposition of a material and subsequent etching to obtain the planarized layer. Examples of such planarizing techniques are known in the art as Resist Etch Back (REB) or Bias Sputtered Quartz (BSQ). Organic self-planarizing materials, such as novolac resin, polyimide, or polymethyl methacrylate (PMMA), may be diluted with solvent to an appropriate viscosity to planarize the particular circuit topography. Inorganic materials, such as spin on glass formations may be used, although the development schemes for these substances is different from that used for the organic materials.

2. If a spun on planarizing layer is employed, this layer is baked to remove the solvent and leave a film with few volatile components. The baking temperatures are within the range of about 50° to about 200° C. for organics or about 100° to about 500° C. for inorganics, to cause flow which seals any pin holes in the planarized layer.

3. A thin film active layer, about 30 to about 160 nm, of chalcogenide glass, arsenic sulfide is deposited 14 and a subsequent thin layer of elemental silver, about 10–40 nm, is deposited onto the chalcogenide glass 16. These materials may be deposited by a variety of methods, including, without limitation, spin casting, physical vapor deposition or chemical vapor deposition. Evaporation and sputtering are favored because of their cleanliness, thickness and stoichiometry control are good.

4. The active layer is exposed to light or other irradiation 18 which causes the elemental silver to diffuse into the arsenic sulfide to create a ternary compound. The ternary compound has different material properties when compared to the arsenic sulfide. The total thickness of the active layer, i.e., arsenic sulfide plus silver, is typically less than about 200 nm. This permits the elemental silver to substantially diffuse through the glass within a reasonable exposure time. The planarized layer acts to protect the substrate from arsenic contamination through the active layer.

5. Any excess unreacted silver is sputtered off 20.

6.
  (a) Unreacted arsenic sulfide is etched in $CF_4$ plasma by RIE 22 to selectively expose the underlying planarized layer. RIE provides the best edge definition due to the anisotropic nature of the etch. The unremoved ternary compound, which is insoluble in $CF_4$, selectively protects the planarized layer during the planarized etch step 24. The process yields a negative of the mask pattern because the exposed material remains after development; or
  (b) A positive image may also be produced by following a different development sequence. In order to produce a positive image, the resist is exposed to the irradiation 18. The first RIE etching development step employs a sulfur gas plasma which etches the ternary compound 23 but only partially etches the arsenic sulfide. An oxygen plasma is then used to etch the underlying planarized layer 24. Those skilled in the art will recognize that the oxygen plasma is employed with an organic planarized layer 24, however, other etchants may be employed for inorganic planarized layers 24. Thus, either a negative or positive image may be achieved using the same resist scheme but employing a different reactant during the development phase.

7. The resulting negative or positive structures may then be used in the microlithography process as a surface mask during a subsequent ion implantation step, etch step, lift-off step, etc. 28, and then stripped afterwards in the same manner as conventional resists. The planarized layer may then be stripped 30 in an $O_2$ plasma. Alternatively, removal of the surface ternary 32 leaves a patterned underlayer as, for example, an inter-metal dielectric which will remain part of the finished circuit.

FIG. 2 diagrammatically illustrates the photoresist at different processing stages. FIG. 2(a) illustrates the photoresist 50 consisting of the substrate 52, the planarized layer 54 which is deposited onto the substrate 52, the chalcogenide layer, arsenic sulfide 56 and the elemental silver layer 58. After exposure to irradiation 18 through mask 51, as illustrated in FIG. 2(b), the unreacted silver is removed by sputtering or by a wet chemical dip leaving the reacted silver/arsenic sulfide ternary 55 and unreacted As-S regions 56. The unreacted arsenic sulfide regions 56 are then removed by reactive ion etching, as is shown in FIG. 2(c), with $CF_4$ to selectively expose the underlying planarized layer 54. The unremoved ternary 55 selectively protects the planarized layer 54 during the subsequent planarized layer etching step, FIG. 2(d), using the reactive ion etching to remove the exposed underlying material without attacking the ternary. Where the planarized layer is an organic material, the planarized layer etch is performed in an oxygen plasma, whereas if the planarized layer were an inorganic layer, the etch reactants are different.

In accordance with the preferred embodiment of the present invention, a particular arsenic sulfide compound has been chosen due to its high resolution capability. $As_{33}S_{67}$ forms a substantially homogeneous, non-phase separate ternary glass when combined with silver. During exposure, the silver ionically diffuses into the arsenic sulfide with minimal lateral spread. The mechanics of the silver dissolution produce an edge-sharpening effect which enhances resolution beyond that which is predictable by diffraction-limited optics. The enhanced resolution provided by the edge-sharpening effect yields a practical contrast value greater than 12. Theoretical resolution is essentially the width of a few atoms because the material has no macromolecular elements as are characteristics of organic photoresists.

Experiments using a conventional optical DSW machine utilizing the arsenic sulfide resist scheme have shown resolution to be better than a half-micron, which is about the theoretical limit for the exposure system.

The $As_{33}S_{67}$ material is extremely easy to deposit by evaporation with good control of layer stoichiometry, as revealed by EDXA. It is important to ensure that there is sufficient silver to dope at least 50% of the entire thickness of the As-S layer. It has been found that a thickness ratio of As-S:Ag in the range of about 5:1 to about 3:1 will provide sufficient photodoping of the silver into the As-S layer. When the Ag is fully diffused into the As-S layer, the final composition lies within the glass forming region of FIG. 3. While the Ag layer may be placed below the As-S, which configuration is necessary for thicker Ag layers so that radiation may readily reach the As-S:Ag interface, resolution under optical exposure tends to be less than satisfactory. For example, for 85 nm $As_{33}S_{67}$ on 21 nm Ag, I-line (365 nm) illumination followed by wet development in an NaOH solution with IPA produce a contrast of less than 1 and poor sensitivity as measured by greater than 40 $mJ/cm^2$. However, when using electron beam lithography, even with a relatively crude wet development step, a 70 nm pitch (35 nm line width) pattern has been produced.

Figure 4:
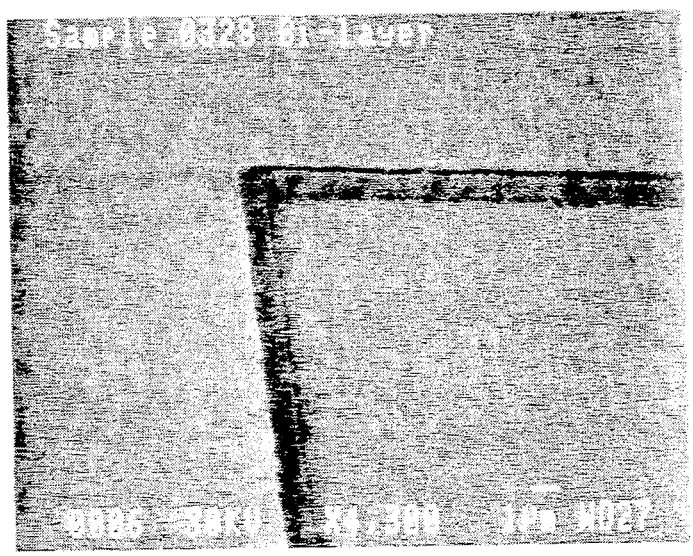
FIG. 4 is a scanning electron micrograph of a typical 1 micron wide line in a multi-layer resist of the present invention.

Plasma development using reactive ion etching with $CF_4$ using a 35 nm Ag on 200 nm $As_{33}S_{67}$ yielded a contrast of 5 with a sensitivity of 20 $mJ/cm^2$. 30 nm Ag on 100 nm $As_{33}S_{67}$ yielded a contrast of 12 with a similar sensitivity. A 1 micron layer of novalac based material, topped with 120 nm $As_{33}S_{67}$ and 25 nm Ag, followed by a $CF_4$ development and an $O_2$ RIE step to etch the novalac, permitted the smallest features on the mask to be readily transferred as illustrated with reference to FIG. 4.

It is important that the stoichiometry of the arsenic sulfide be approximately 33 at % As, 67 at % S, otherwise a grainy phase-separated film may form. Additionally, other chalcogenides, such as germanium selenide are characterized by greater lateral diffusion than arsenic sulfide and other diffusion materials, such as copper, tend to thoroughly diffuse with little or no applied radiation.

By applying a thin silver coating onto the arsenic sulfide layer, the applied radiation penetrates the silver and is absorbed at or near the As-S/Ag interface. Because the arsenic sulfide layer is almost opaque for wavelengths shorter than 400 nm, the net result is that very little radiation will reach the underlying substrate to be reflected back to the active layers. This has the obvious benefit, in optical lithography, of eliminating reflective notching. The existence of the planarized layer also is important in electron-beam lithography in that a relatively low beam energy will greatly reduce the production of back scattered and secondary electrons from the substrate.

An additional benefit of the present invention is that the active layer is sensitive to a wide range of radiation wavelengths, which facilitate combined exposure techniques on the same resist layer, e.g., optical and electron-beam, which may be combined to improve product throughput.

Those skilled in the art will understand and appreciate that the foregoing described multi-layer resist scheme and method does not suffer from the problems of conventional resists and provides a number of added benefits. The multi-layer resist scheme and method of the present invention reduces the equipment need and facilitates high definition microlithography resists without complex processing.

We claim:

1. A method for forming a multi-layer resist material for microlithography, comprising the steps of:
    depositing a planarized layer onto a substrate,
    depositing an active layer onto the surface of the planarized layer, said active layer comprising a layer of arsenic sulfide and a layer of silver metal, said layer of arsenic sulfide consisting essentially of about 28–37 at % As and about 63–72 at % S;
    exposing said active layer to radiation, thereby doping exposed portions of said silver layer into said arsenic sulfide layer and forming an silver-doped arsenic sulfide region,
    removing unexposed silver from said arsenic sulfide layer,
    etching one of said arsenic sulfide layer or said silver-doped arsenic sulfide region,
    etching said planarized layer underlying said etched arsenic sulfide or said silver-doped arsenic sulfide region, at least one of stripping said arsenic sulfide silver doped area or etching said silver-doped arsenic sulfide region, thereby forming a resist pattern capable of better than one-half micron resolution microlithography.

2. A method for forming a multi-layer resist material for microlithography according to claim 1, wherein said planarized layer is selected from the group consisting of novalac resin, polyimide, and polymethyl methacrylate.

3. A method for forming a multi-layer resist material for microlithography according to claim 1, wherein said planarized layer is self-levelling spin-on glass.

4. A method for forming a multi-layer resist material for microlithography according to claim 1, wherein said planarized layer is deposited by one of bias quartz deposition or resist etch back deposition.

5. A method for forming a multi-layer resist material for microlithography according to claim 1, wherein said arsenic sulfide layer forms a chalcogenide glass upon doping with the silver layer.

6. A method for forming a multi-layer resist material for microlithography according to claim 1, wherein said arsenic sulfide consists of 33 at % As and 67 at % S.

7. A method for forming a multi-layer resist material for microlithography according to claim 1, wherein said active layer is less than about 200 nm thick.

8. A method for forming a multi-layer resist material for microlithography according to claim 1, wherein a thickness ratio of arsenic sulfide to Ag is in the range of about 5:1 to about 3:1.

9. A method for forming a multi-layer resist material for microlithography according to claim 1, wherein said step of exposing said active layer further comprises optical, ion beam, electron beam, x-ray or laser irradiation.

10. A method for forming a multi-layer resist material for microlithography according to claim 1, further comprising the steps of exposing the active layer to irradiation, thereby forming a ternary compound of the arsenic sulfide and silver; and removing unreacted silver from the surface of the irradiated active layer, etching unreacted arsenic sulfide by reactive ion etching, and removing portions of the planarized layer by etching, to form a negative image of the exposed area.

11. A method for forming a multi-layer resist material for microlithography according to claim 10, in which said unreacted arsenic sulfide is etched by reactive ion etching in a $CF_4$ plasma.

12. A method for forming a multi-layer resist material for microlithography according to claim 1, further comprising the steps of exposing the active layer to irradiation thereby forming a ternary compound of the arsenic sulfide and silver; and etching said ternary compound and removing portions of the planarized layer by etching to form a positive image of the exposed area.

13. A method for forming a multi-layer resist material for microlithography according to claim 12 in which said ternary compound is etched by reactive ion etching in a sulfur gas plasma.

14. A multi-layer resist material for microlithography formed by the method according to claim 1.

15. A multi-layer resist material for microlithography formed by the method according to claim 2.

16. A multi-layer resist material for microlithography formed by the method according to claim 3.

17. A multi-layer resist material for microlithography formed by the method according to claim 4.

18. A multi-layer resist material for microlithography formed by the method according to claim 5.

19. A multi-layer resist material for microlithography formed by the method according to claim 6.

20. A multi-layer resist material for microlithography, comprising:

a substrate;

a planarized layer deposited onto said substrate; and an active layer deposited onto said planarized layer, said active layer comprising a layer of arsenic sulfide and a layer of silver, wherein said active layer forms a non-phase separated ternary compound upon exposure to irradiation.

21. The multi-layer resist material according to claim 20, wherein said planarized layer is selected from the group consisting of novalac resin, polyimide, and polymethyl methacrylate.

22. The multi-layer resist material according to claim 20, wherein said planarized layer further comprises self-levelling spin-on glass.

23. The multi-layer resist according to claim 20, wherein said arsenic sulfide layer is chalcogenide glass.

24. The multi-layer resist according to claim 20, wherein said arsenic sulfide consists of 33 at % As and 67 at % S.

25. The multi-layer resist according to claim 20, wherein said active layer has a thickness of less than about 200 nm.

26. The multi-layer resist according to claim 20, wherein a thickness ratio of arsenic sulfide to silver is in the range of about 5:1 to about 3:1.

* * * * *